United States Patent [19]

Narozny

[11] 3,902,153

[45] Aug. 26, 1975

[54] CIRCUIT BOARD SOCKET

[75] Inventor: Ronald S. Narozny, Panorama City, Calif.

[73] Assignee: Thomas & Betts Corporation, Elizabeth, N.J.

[22] Filed: Sept. 23, 1974

[21] Appl. No.: 508,036

[52] U.S. Cl.......... 339/214 R; 339/17 C; 339/258 R

[51] Int. Cl.²............................................ H01R 13/42

[58] Field of Search....................... 339/17, 214–217, 339/256, 258, 262

[56] References Cited

UNITED STATES PATENTS

| | | | |
|---|---|---|---|
| 1,906,469 | 5/1933 | Knutson | 339/262 P |
| 3,237,149 | 2/1966 | West | 339/256 R |
| 3,864,004 | 2/1975 | Friend | 339/17 R |

*Primary Examiner*—Joseph H. McGlynn
*Attorney, Agent, or Firm*—David Teschner; Jesse Woldman

[57] ABSTRACT

A circuit board socket comprises an inner spring means telescopingly disposed within a tubular housing about which is fitted an outer spring means, to provide a composite assembly arranged to be press fitted into a suitable socket receiving aperture in a circuit board or the like with the inner spring means having converging leg portions adapted to securely engage a terminal pin inserted therewithin. The outer spring means is provided with a sleeve portion encircling the housing and terminating selectively arched and outwardly bowed finger portions adapted to engage either the plated or unplated interior of the circuit board aperture to provide mechanical and electrical engagement therewith.

10 Claims, 9 Drawing Figures

CIRCUIT BOARD SOCKET

BACKGROUND OF THE INVENTION

1. Field of the Invention:

The invention is directed to electrical connectors for circuit boards or the like.

2. Description of the Prior Art:

In recent years there has been an increasing use of printed circuit boards for electrical and electronic applications in which various portions of the circuitry comprise conductive strips disposed adjacent either one or both surfaces of a pressed dialectric material such as phenolic or the like, and comprising copper strips formed generally by etching the surface of the board in suitable patterns to provide interconnecting conductive paths between selectively located points on the board. These boards are often punched drilled, or otherwise apertured to provide through-holes adapted to receive either the terminal ends of circuit elements such as resistors and the like or conventional stranded or solid conductor wires adapted to interconnect one printed circuit board to another or to a further electrical element. To facilitate the rapid insertion and removal of such elements from the printed circuit board it is desirable to provide means inserted within the through-holes to permit a terminal pin or the like to be removably inserted therewithin while insuring adequate electrical contact with the surrounding circuitry adjacent the throughhole. In such cases, there may be provided a socket adapted to be press fitted within the through-hole and having pin engaging means associated therewith which pin engaging means is arranged to resiliently encompass a lead or terminal pin inserted therewithin to provide the necessary electrical contact thereto. One such prior art device is disclosed in U.S. Pat. No. 3,681,738 issued Aug. 1, 1972 to Lindsay C. Friend and comprises a dual element socket including an eylet type housing encompassing a formed spring member having an internally disposed spring section adapted to engage a terminal pin or the like, said spring member extending upwardly out of the mouth of the housing and having a curled portion terminating in an outer spring section disposed adjacent the outer periphery of the housing. Accordingly, the spring member is free to move relative to the housing in the area adjacent the curled portion, thereby resulting in a movable joint which may be subject to oxidation, corrosion, and other adverse effects tending to increase the contact resistance and reduce the electrical integrity therebetween.

SUMMARY OF THE INVENTION

The invention overcomes the limitations and difficulties noted above with respect to prior art devices by providing a multiple element circuit board socket assembly which is more positive, reliable, and more versatile than such prior art devices. The socket may be readily manufactured from flat stock suitably formed to provide a series of discrete interfitting tubular-like elements including an inner spring means terminating at one end in resilient, converging leg portions arranged to receive a terminal pin or the like, the other end of the inner spring means including a head portion having outwardly depending tabs securely coupled to the shoulder portion adjacent the open end of an elongate tubular housing. The shoulder portion of the housing may be provided with an upstanding lip portion which may be tightly curled about the outer periphery of the inner spring means head portion to minimize the extension of the socket above the printed circuit board and to provide secure electrical and mechanical interengagement between the housing and the inner spring means. The resulting enlarged head portion has the additional advantage of inhibiting the wicking of solder into the pin receiving aperture during flow slow solder operation since the head portion is adapted to seat firmly against the adjacent circuit board surface to provide a seal thereat. Surrounding the tubular housing is a discrete, independently deflectable outer spring means having a sleeve portion provided preferably with an open seam to permit flexure of the sleeve portion for intimate engagement about the exterior surface of the tubular housing, the outer spring means further including resilient, extending finger portions selectively configured to engage the sidewall of a circuit board aperture to provide a tight, secure assembly thereat. It is therefore an object of this invention to provide an improved electrical socket.

It is another object of this invention to provide an electrical socket for circuit boards or the like.

It is a further object of this invention to provide an electrical socket arranged to releasably electrically couple a conductor to selective conductive elements of a printed circuit board or the like.

It is yet a further object of this invention to provide an improved electrical socket receivable within a relatively loosely toleranced through-hole in a circuit board or the like.

It is still another object of this invention to provide an improved circuit board socket having independently deflectable inner and outer spring means.

It is still a further object of this invention to provide an improved circuit board contact assembly the elements of which may be inexpensively manufactured from flat stock.

It is yet another object of this invention to provide an electrical socket arranged to releasably connect a terminal pin or the like to conductive elements located on either one or both sides of a printed circuit board or the like.

It is yet a further object of this invention to provide an improved circuit board socket having an extremely low profile.

Other objects and features will be pointed out in the following description and claims and illustrated in the accompanying drawings, which disclose, by way of example, the principle of the invention and the best mode contemplated for carrying it out.

BRIEF DESCRIPTION OF THE DRAWINGS

In the Drawings.

Similar elements are given similar reference characters in each of the respective drawings.

DESCRIPTION OF THE PREFERRED EMBODIMENTS

Figure 1:
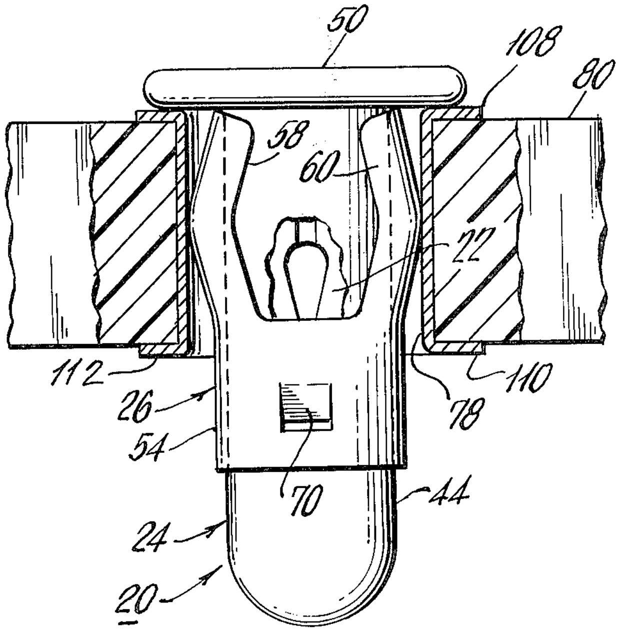
FIG. 1 is a front elevational view, partly in section, showing a circuit board socket constructed in accordance with the concepts of the invention and installed within a circuit board aperture.
Figure 4:
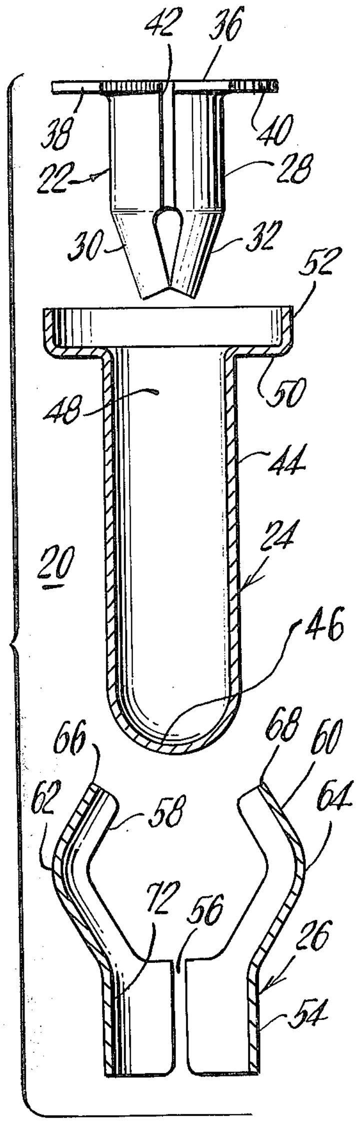
FIG. 4 is an exploded view, partly in section, showing the elements of the device of FIG. 1 in a disassembled state.
Figure 2:
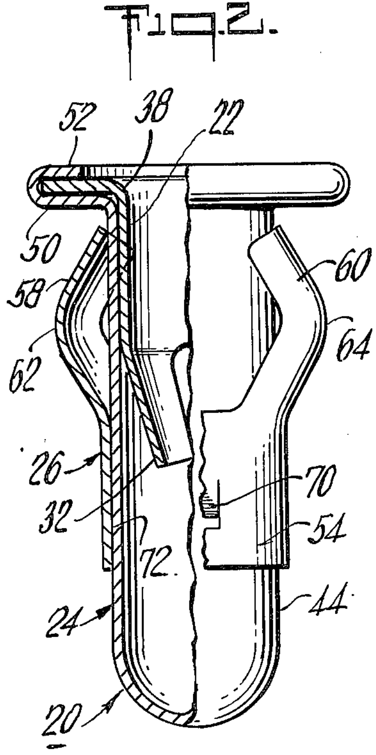
FIG. 2 is a front elevational view, partly cut away and partly in section, showing further details of the device of FIG. 1.
Figure 3:
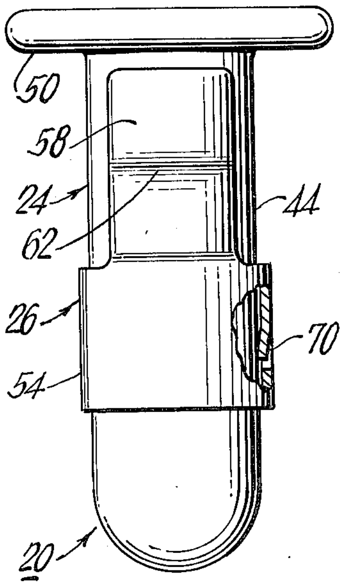
FIG. 3 is a side elevational view, partly in section, of the device of FIG. 1.
Figure 5:
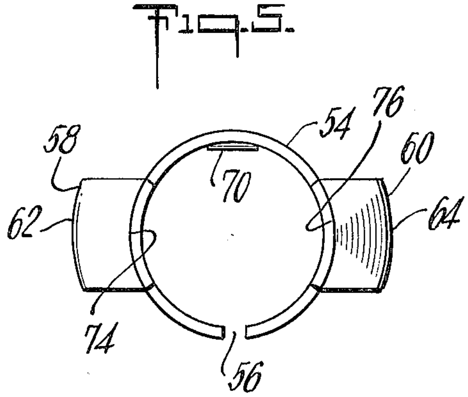
FIG. 5 is a top plan view of the outer spring means of the device of FIG. 1.
Figure 6:
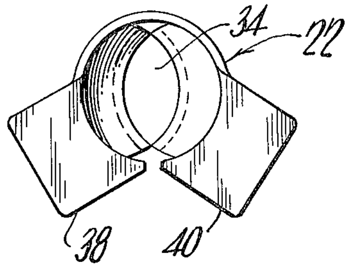
FIG. 6 is a top plan view of the inner spring means of the device of FIG. 1.
Figure 7:
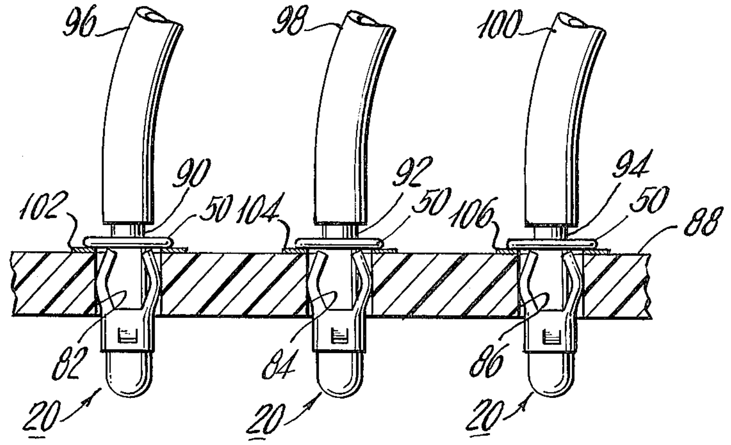
FIG. 7 is a front elevational view, partly in section, showing a plurality of cirucit board sockets of the instant invention connected to a printed circuit board.

Turning now to FIGS. 1 through 7 there is shown a circuit board socket 20 constructed in accordance with the concepts of the invention. The socket 20 comprises an inner spring means 22 telescopingly disposed within a tubular housing 24 encompassed by an outer spring means 26, each element being shown in greater detail in the exploded view of FIG. 4. As illustrated in FIG. 4, the inner spring means 22 comprises a body portion 28 of generally tubular configuration and having an essentially uniform transverse dimension throughout its length and terminating in a pair of like curved leg portions 30, 32 which converge towards one another to provide a generally elliptical opening 34 (FIG. 6) at the terminating ends thereof. The other end of the body portion 28 of the inner spring means 22 is defined by a head portion 36 having a pair of tab means 38 and 40 extending therefrom generally normal to the longitudinal axis of the inner spring means 22. For ease of manufacturing, the inner spring means 22 may be stamped from flat stock and suitably formed into the desired shape which may include an open seam 42 facilitating resilient expansion of the inner spring means 28 in response to the insertion therewithin of a terminal pin or the like. The tubular housing 24 comprises a shank portion 44 of preferably uniform exterior transverse dimension throughout its length and which may be inexpensively manufactured in eyelet-like fashion on conventional eyelet forming machines well known in the art. The tubular housing 24 is closed at one end, as at 46, the other end 48 of housing 24 being open and flaring outwardly to provide a shoulder portion 50 terminating in a lip 52 which is arranged to be folded or curled tightly about the tabs 38 and 40 of the inner spring means 22 as shown, for example, in detail in FIG. 2. Accordingly, the inner spring means 22 is thus securely coupled to the tubular housing 24 to provide reliable mechanical and electrical interengagement therebetween. Increased electrical contact between these two elements may be further provided by dimensioning the respective elements in such manner as to provide a relatively close fit between the exterior surface of the body portion 28 of the inner spring means 22 and the interior surface of the tubular housing 24. It will of course be readily apparent to those skilled in the art that the body portion 28 of the inner spring means 22 may be suitably dimensioned to provide a given gap between its exterior surface and the interior surface of the housing 24 to facilitate increased outward deflection of both the body and leg portions of the inner spring means 22 to accommodate a wider range of terminal pin sizes. The outer spring means 26 includes a sleeve portion 54 having an interior dimension arranged preferably to provide a relatively tight fit about the exterior of the tubular housing 24, and which may be provided with an open seam 56 permitting expansion of the sleeve portion 54 (FIG. 4) for ease of assembly to the tubular housing 24. Extending generally longitudinally from one end of the sleeve portion 54 are finger portions 58 and 60 which are bowed generally intermediate their length as at 62 and 64, respectively, the bowed portions 62 and 64 extending beyond the maximum exterior dimension of the sleeve portion 54, the finger portions 58 and 60 then turning inwardly and terminating at ends 66 and 68, respectively, the spacing between the ends 66 and 68 of the finger portions 58 and 60 closely approximating the exterior dimension of the tubular housing 24. As shown in greater detail in FIGS. 3 and 5, the sleeve portion 54 of the outer spring means 26 is provided with locking means such as a lanced portion 70 deformed inwardly to engage the exterior of the tubular housing 24 as the outer spring means 26 is assembled thereover. It will of course be readily apparent to those skilled in the art that many other forms of locking means may be employed to accomplish this purpose and may include mating detents and recesses disposed at given locations within the respective socket elements. The sleeve portion 54 of the outer spring means 26 comprises a relatively smooth interior surface 72 to provide maximum surface interengagement with the housing 24 to minimize any electrical contact resistance existing therebetween. As further shown in FIG. 5, each of the finger portions 58 and 60 of the outer spring means 26 is arched about its longitudinal axis to provide a concave interior surface 74, 76 respectively, having a radius of curvature preferably approximating the radius of curvature of the adjacent exterior surface of the tubular housing 24. In this manner, the terminating ends 66 and 68 of the finger portions 62 and 64, respectively, may slide more readily against the exterior surface of the tubular housing 24 as they are deflected inwardly upon engagement with the respective sides of a socket receiving aperture such as 78 (FIG. 1) in a printed circuit board such as 80 upon the installation of the socket 20 thereinto. The transverse dimension of the aperture 78 is suitably proportioned to be slightly less than the transverse dimension across the bowed portions 62 and 64 of the finger portions 58 and 60 of the outer spring means 26 so that insertion of the socket 20 within the aperture 78 is accomplished by forcing the socket 20 thereinto sufficiently to cause the bowed portion 62 and 64 of the finger portions 58 and 60 to contact the sides of the aperture 78 whereby the finger portions 58 and 60 are caused to be deflected inwardly while bearing against the sides of the aperture 78. The socket 20 is accordingly held in position within the aperture 78 as a result of the outward pressure exerted by the finger portions 58 and 60 against the sides of the aperture 78. It will be further noted that the employment of discrete inner and outer spring means results in a condition in which any stress introduced by the flexure of the finger portions 58 and 60 is not transmitted to the converging leg portions 30 and 32 of the inner spring means 22 so that the size of the aperture 78 into which the circuit board socket is to be inserted will have no effect on the degree of pressure exerted by the converging leg portions 30 and 32 upon a pin or lead inserted within the inner spring means 22, thus providing a distinct advantage over prior art devices in which the inner and outer spring members are formed from a common element and are therefore interdependent with respect to the deflection characteristics thereof. It will also be noted that the instant construction which includes independently deflectable inner and outer spring means results in a low profile socket 20 in which the portion thereof extending above the surface of the printed circuit board 80 is governed primarily by the thickness of the stock employed in forming the housing 24 and the inner spring means tabs 58 and 60. In the embodiments illustrated in the drawings, the total height of the socket 20 above the circuit board 80 is equal to twice the thickness of the material comprising the housing 24 plus the thickness of the material comprising the inner spring means tab portions 58 and 60, resulting in a total extension substantially less than that obtainable in prior art devices as referred to hereinabove. Turning now to FIG. 7 there is shown a plurality, namely, three circuit board sockets 20 inserted into respective apertures 82, 84 and 86 extending through the thickness of a printed circuit board 88 similar to the board 80 shown in FIG. 1. Each of the circuit board sockets 20 is shown as having inserted therein a terminal pin 90, 92, 94, connected to an associated conductor 96, 98 and 100, respectively, to provide a disconnectable electrical connection between the conductors 96, 98 and 100 and conductive elements 102, 104 and 106, respectively, overlying the insulative portion of the board 88. In the case illustrated in FIG. 7, the conductive elements 102, 104 and 106 of the printed circuit board 88 terminate at the respective apertures 82, 84 and 86, so that electrical engagement between the sockets 20 and elements 102, 104 and 106 is accomplished by contact between the shoulder portion 50 of the sockets 20 and the adjacent conductive portions 102, 104 and 106 of the printed circuit board 88. In the arrangement illustrated in FIG. 1, however, there is shown a printed circuit board conductive element 108 which extends from the insulative portion of the printed circuit board 80 into the socket receiving aperture 78 thereby providing a conductive wall therefore, while extending around the lower end of the aperture 78 and against the underlying surface of the printed circuit board 80 as at 110, and 112. In this arrangement, electrical contact between the circuit board socket 20 and the conducting element 108 of the printed circuit board 80 is accomplished both by the contact between the shoulder portion 50 of the tubular housing 24 with the adjacent surface of the conductive element 108 and the engagement of the exterior surface of the finger portions 58 and 60 with the conductive sidewalls of the aperture 78. The electrical engagement afforded by the pressure of the finger portions 58 and 60 of the outer spring means 26 against the conductive element 108 extending within the aperture 78 of the printed circuit board 80 may be augmented by the addition of solder 114 (FIG. 9) which is applied between the outer spring means 26 and the conductive portion 108 extending within the printed circuit board aperture 78.

Figure 9:
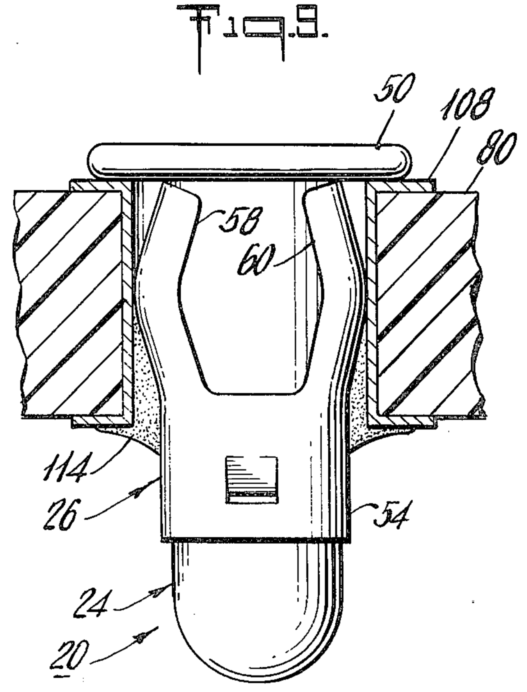
FIG. 9 is a front elevational view, partly in section, showing the device of FIG. 1 soldered to the conductive lining of a circuit board aperture.

As further illustrated in FIG. 9, the enlarged head portion of the socket 20 seats firmly against the adjacent surface of the circuit board 80 when fully installed within the socket receiving aperture, thereby providing a seal thereat and inhibiting the wicking of solder 114 around the head portion and into the pin receiving aperture of socket 20 during the solder operation. This feature is especially effective in those applications in which the circuit board 80 is subjected to a flow solder bath (not shown) where the pressure developed beneath the board tends to drive the solder upward into the various crevices between adjacent elemental surfaces to a degree in excess of that generated merely by capillary action. A similar arrangement may be employed to provide a through connection in a circuit board aperture such as 78 where the interior wall of the aperture 78 is devoid of conductive material although flanked by conductive segments at either end. In such case, a continuous electrical conductive path may be established between the upper and lower conductive elements through the elements including the circuit board socket 20, solder 114, and the underlying conductive element disposed on the lower side of the circuit board. A terminal pin inserted within the socket 20 may thus be releasably connected simultaneously to both the upper and lower conductive elements of the printed circuit board.

Figure 8:
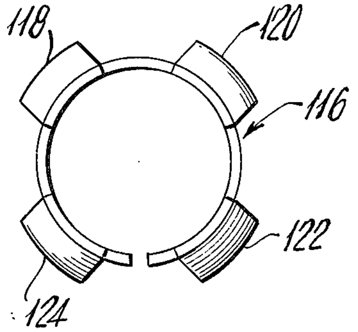
FIG. 8 is a top plan view of a further embodiment of an outer spring means of a circuit board socket constructed in accordance with the concepts of the invention.

Turning now to FIG. 8 there is shown a further embodiment of an outer spring means 116 constructed in accordance with the concepts of the invention. As illustrated, there are provided, additional, namely four finger portions 118, 120, 122 and 124, each essentially duplicative of the finger portions 62 and 64 of the circuit board socket 20 and having similar bowed and arched characteristics as described heretofore above. The additional finger portions provided by the arrangement illustrated in FIG. 8, will provide, where necessary or desirable, an increased area of engagement between such finger portions and the interior wall of a socket aperture in a printed circuit board such as 80. It will, of course, be readily apparent that the exact number of finger portions employed is not critical, and that any number thereof may be provided in similar manner within the concepts of the invention. Similarly the inner spring means 22, shown in the drawings as comprising a pair of like converging leg portions 30 and 32, may be further divided so as to provide three or more such converging leg portions, where necessary or desirable.

The elements of the circuit board socket 20, namely, the inner spring means 22, the housing 24 and the outer spring means 26, may be inexpensively manufactured from flat conductive material such as beryllium copper, phosphor bronze, brass or the like, to provide an adequate reliable, and long lasting electrical connection in use.

The embodiments of the invention in which an exclusive property or privilege is claimed are defined as follows:

1. A circuit board socket comprising, in combination: a resilient tubular inner spring means having converging leg portions adjacent one end thereof and outwardly extending tab means adjacent the other end thereof, said inner spring means being arranged to resiliently engage a terminal pin inserted therewithin; an elongate tubular housing closed at one end and having a flared portion adjacent the other end, said inner spring means being telescopingly disposed within said housing, said inner spring means tab means being coupled to said housing flared portion to provide electrical engagement therebetween; and a discrete outer spring means having a hollow sleeve portion and diverging resilient finger portions extending outwardly from said sleeve portion adjacent one end thereof, said outer spring means sleeve portion being telescopingly disposed about the exterior of said housing and tightly fitted thereabout, said finger portions being arranged to engage the inner surface of a socket receiving aperture in a circuit board to support said socket therewithin.

2. A circuit board socket as defined in claim 1 wherein said outer spring means sleeve portion has a generally uniform interior transverse dimension throughout its length.

3. A circuit board socket as defined in claim 1 wherein each of said outer spring means finger portions is selectively arched about its longitudinal axis to provide a concave interior surface facing the adjacent exterior surface of said tubular housing.

4. A circuit board socket as defined in claim 1 wherein each of said outer spring means finger portions is selectively bowed outwardly generally intermediate its length.

5. A circuit board socket as defined in claim 1 wherein said tubular housing has a generally circular cross section and each of said outer spring means finger portions is selectively arched about its longitudinal axis to provide a concave interior surface having a radius of curvature approximating the radius of curvature of said tubular housing.

6. A circuit board socket as defined in claim 1 wherein said outer spring means sleeve portion has an open seam extending the length thereof to permit transverse flexure of said sleeve portion.

7. A circuit board socket as defined in claim 1 wherein each of said outer spring means finger portions has a terminating end located adjacent said flared portion of said tubular housing.

8. A circuit board socket as defined in claim 1 wherein said inner spring means comprises a central portion having a generally uniform exterior transverse dimension throughout substantially its entire length, said central portion exterior transverse dimension being arranged to closely approximate the interior transverse dimension of said tubular housing to provide a close fit therebetween.

9. A circuit board socket as defined in claim 1, said outer spring means sleeve portion further comprising means for locking said outer spring means to said tubular housing.

10. A circuit board socket as defined in claim 9 wherein said locking means comprises a lanced portion struck from said outer spring means sleeve portion and having a free end turned inwardly towards the interior of said sleeve portion.

* * * * *

UNITED STATES PATENT AND TRADEMARK OFFICE

CERTIFICATE OF CORRECTION

PATENT NO. : 3,902,153

DATED : August 26, 1975

INVENTOR(S) : Ronald S. Narozny

It is certified that error appears in the above-identified patent and that said Letters Patent are hereby corrected as shown below:

Column 2, line 8, delete "slow"

Signed and Sealed this

*sixteenth* Day of *December 1975*

[SEAL]

*Attest:*

RUTH C. MASON
*Attesting Officer*

C. MARSHALL DANN
*Commissioner of Patents and Trademarks*